(12) United States Patent
Kawai

(10) Patent No.: US 6,566,806 B1
(45) Date of Patent: May 20, 2003

(54) LUMINESCENCE DEVICE, AND IMAGE-READING APPARATUS, DATA-PROCESSING APPARATUS AND DISPLAY APPARATUS INCLUDING THE DEVICE

(75) Inventor: Tatsundo Kawai, Hadano (JP)

(73) Assignee: Canon Kabushiki Kaisha, Tokyo (JP)

( * ) Notice: Subject to any disclaimer, the term of this patent is extended or adjusted under 35 U.S.C. 154(b) by 122 days.

(21) Appl. No.: 09/703,811

(22) Filed: Nov. 2, 2000

(30) Foreign Application Priority Data

Nov. 8, 1999 (JP) .......................................... 11-316683

(51) Int. Cl.$^7$ ................................................ H01J 1/62
(52) U.S. Cl. ...................... 313/504; 313/501; 313/506; 313/507
(58) Field of Search ................................ 313/503, 504, 313/506, 500, 501, 507; 428/690; 362/84, 231; 315/169.3

(56) References Cited

U.S. PATENT DOCUMENTS 4,737,896 A    4/1988  Mochizuki et al. ......... 362/301
5,917,280 A  * 6/1999  Burrows et al. ............ 313/506
6,284,393 B1 * 12/2001 Hosokawa et al. ......... 428/690
6,376,857 B1 * 4/2002  Imai ........................... 250/591

* cited by examiner

Primary Examiner—Robert H. Kim
Assistant Examiner—Elizabeth Gemmell
(74) Attorney, Agent, or Firm—Fitzpatrick, Cella, Harper & Scinto

(57) ABSTRACT

A luminescence device is formed of a substrate, and a laminated layer structure formed on the substrate including a plurality of luminescence layers emitting different luminescence colors, and a plurality of electrodes forming pairs of electrodes each sandwiching an associated luminescence layer. At least one of the plurality of electrodes are provided with apertures, through which a luminescence flux emitted from at least one of the luminescence layers is transmitted. As a result, the luminescence device can emit different luminescence colors expected to cause color mixing with each other with a minimum of positional difference leading to color irregularity.

9 Claims, 7 Drawing Sheets

LUMINESCENCE DEVICE, AND IMAGE-READING APPARATUS, DATA-PROCESSING APPARATUS AND DISPLAY APPARATUS INCLUDING THE DEVICE

FIELD OF THE INVENTION AND RELATED ART

The present invention relates to an (electro-)luminescence device utilized in copying machines, printers and display apparatus, e.g., as a backlight device for a display apparatus and a light source for illuminating an original in an image-reading apparatus.

Hitherto, as light-emission devices for converting applied electricity into light, there have been used, e.g., tubes and bulbs, such as incandescent lamps utilizing light emission caused by resistance heating and fluorescent tubes utilizing light emission caused by discharge in dilute gas, and semiconductor devices, such as light-emitting diodes (LED) utilizing light-emission caused by recombination of electrons and holes at pn-junctions formed in organic crystals. As indoor or outdoor illumination light sources, the tubes and bulbs have been most frequently used, but LEDs have been frequently used as indicators for various electronic appliances. Furthermore, recently, liquid crystal display apparatus equipped with fluorescent lamps as a backlight have been used as a display device for computers and portable display terminals. In addition to such usages directly exposed to human eyes, there have been frequently used functional devices, such as light sources for illuminating originals in image reading apparatus for facsimile apparatus and image scanners, and photo-writing heads in LED printers.

These light source devices have their own advantages and disadvantageous depending on their types. For example, the tubes and bulbs are suitable for emitting intense light by receiving a large electric power but are large in size and liable to be broken. Further, they are not suitable for usages requiring a high-speed responsiveness. On the other hand, LEDs can emit only relatively weak light but are advantageous in that they are small in size, have excellent reliability and have high-speed responsiveness.

While not being as popular as the above-mentioned light sources, there has been partially used an electroluminescence device wherein a thin film layer comprising a crystalline fluorescent substance is formed on a substrate by coating or vapor deposition and is supplied with an AC electric field via an insulating layer to cause luminescence. Such an electroluminescence device can be formed in a thin film on a substrate and is advantageous for usages for uniformly illuminating wide ranges or for providing a small-sized, particularly a thin, apparatus including a light source.

However, such an electroluminescence device has drawbacks that it can only emit weak light even lower than an LED and requires a difficult drive scheme requiring a relatively high AC voltage, so that it has not been a popular light source device.

On the other hand, in recent years, there has been developed an organic film luminescence device (also called an organic LED device), which is provided in a film on a substrate, provides high luminance and allows a DC drive.

FIG. 11 illustrates a representative organization (laminar structure) of such an organic LED device.

Referring to FIG. 11, an organic LED device includes a substrate 1100, an anode 1201 comprising a transparent electrode of indium tin oxide (ITO), a hole-transporting layer 1202 comprising an organic hole-transporting material, such as an organic diamine (of, e.g., formula (1) below), an electron-transporting layer 1203 comprising an organic electron-transporting material, such as tris(8-quinolinolato)aluminum (of formula (2) below) and a cathode 1204 of a substance having a low work function such as Al and/or Hg—Ag alloy, laminated in this order.

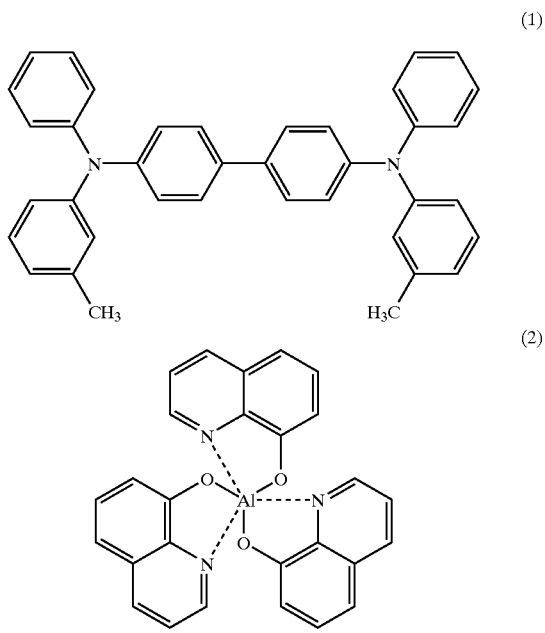

When a voltage is applied between the anode 1201 and the cathode 1204, holes injected from the anode 1202 to the hole-transporting layer 1202 and electrons injected from the cathode 1204 to the electron-transporting layer, are re-combined to cause luminescence.

FIG. 12 illustrates a state of luminescence occurring in the organic LED device of FIG. 11.

Referring to FIG. 12, a portion denoted by A schematically represents the luminescence caused by recombination of holes injected to the hole-transporting layer 1202 from the anode 1201 and electrons injected to the electron-transporting layer 1203 from the cathode 1204.

Such organic LED devices can emit various colors of luminescence, e.g., by using different organic materials for the hole-transporting layer 1202 or the electron-transporting layer 1203, by admixing another organic material into these layers, or by inserting a luminescence layer comprising another organic material between these layers.

However, according to a conventional organic LED device, the luminescence color is determined by organic materials constituting a luminescence part, so that pixels of respectively different luminescence colors have to be formed in a usage, like a full-color display, requiring independent control of different luminescence colors.

FIG. 13 illustrates a typical organization of such an organic LED device.

Referring to FIG. 13, the organic LED device includes a substrate 1100; a first pixel comprising an anode (portion) 1201 comprising ITO for the first pixel, a hole-transporting layer (portion) 1202 of an aromatic diamine (of formula (1)), an electron-transporting layer/luminescence layer 1203 of tris(8-quinolinolato)aluminum (of formula (2)) and a cathode 1204 of Al or Hg—Ag alloy, etc.; and also a second pixel comprising an anode (portion) 1401 comprising ITO, a hole-transporting layer (portion) 1202 of an aromatic diamine (of formula (1)), an electron-transporting layer/ luminescence layer 1203 of a mixture of tris(8-quinolinolato)aluminum complex (of formula (2)) and a fluorescent substance (of formula (3) below), and a cathode 1404 of Al or Mg—Ag alloy.

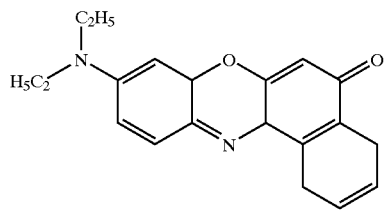

(3)

In the above-mentioned device, the first pixel emits green luminescence, and the second pixel emits red luminescence.

In the device, the respective luminescence layers 1203, 1403 and the respective cathodes 1204, 1404, have to be patterned into shapes of the respective pixels. Moreover, if the cathodes 1204 and 1404 of the adjacent pixels directly contact each other, or even in a single pixel, if the cathode 1204 (1404) directly contacts the anode 1202 (1401) or the hole-transporting layer 1202 (1402), phenomena, such as crosstalk and current leakage, undesirable for the device performances, are liable to occur, so that the mutually adjacent pixels have to be formed in sufficient separation from each other.

In this case, as different luminscence colors are emitted from different pixels, different color pixels are liable to be noticeable to human eyes by a careful observation, thus providing an unsatisfactory display quality.

When such an organic LED device is used as a light source for illuminating an original in an image reading apparatus, the directively of illumination light reaching a certain point on the original can be different for respective luminescence colors due to the fact that different luminescence colors are emitted from fairly separated different pixels, so that color irregularity is liable to occur depending on the surface gloss of the original.

SUMMARY OF THE INVENTION

In view of the above-mentioned problems of the prior art, a principal object of the present invention is to provide a luminescence device, particularly an organic LED device, having a minimized difference in sites for emitting different luminescence colors.

According to the present invention, there is provided, a luminescence device, comprising a substrate, and a laminated layer structure formed on the substrate including a plurality of luminescence layers emitting different luminescence colors, and a plurality of electrodes forming at least one pair of electrodes each sandwiching an associated luminescence layer, wherein at least one of the plurality of electrodes is provided with apertures, through which a luminescence flux emitted from at least one of the luminescence layers is caused to pass.

Each of the plurality of luminescence layers may comprise one or more organic compound layers. In the luminescence device, plural layers of electrodes each belonging to different pairs of electrodes sandwiching associated luminescence layers of different luminescence colors are respectively provided with apertures of which positions and/or sizes may be at least partially different from each other. Further, each pair of electrodes sandwiching an associated luminescence layer may comprise one transparent electrode on a side closer to the substrate and the other opaque electrode provided with apertures on a side more remote from the substrate, so that the luminescence flux is emitted through the substrate.

Further, at least: one luminescence layer may be sandwiched by a pair of electrodes which are both provided with apertures of which positions and/or sizes are at least partially different from each other so that the pair of electrodes comprises one transparent electrode on a side closer to the substrate and the other opaque electrode, and luminescence light flux is emitted in a direction leaving away from the substrate.

The present invention further provides an image-reading apparatus including a luminescence device as described above as an illumination light source, and a data processing apparatus including such an image-reading apparatus as a data-reading unit.

The present invention further provides a display apparatus including a luminescence device as described above as a display unit.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
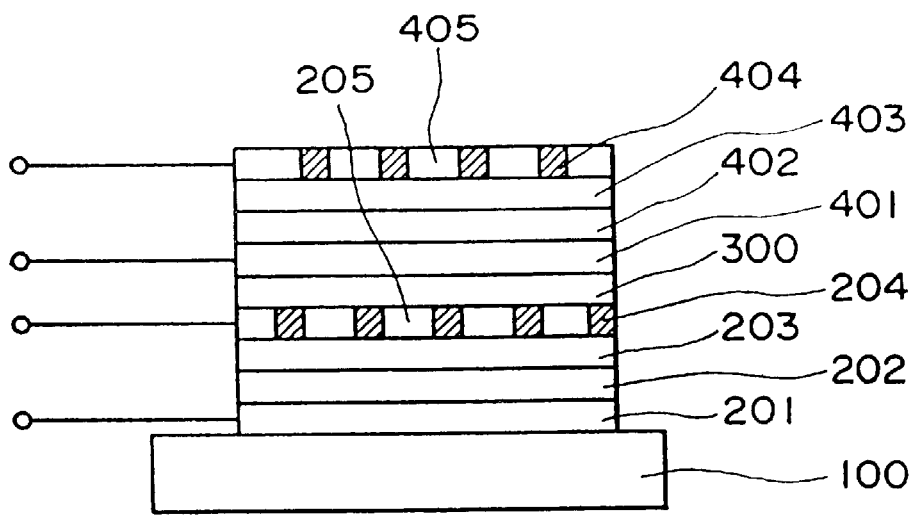
FIGS. 1, 3 and 5 are schematic sectional views showing organization of organic LED devices according to a first, a second and a third embodiment, respectively, of the invention.

FIG. 1 illustrates a laminar organization of an organic LED device according to a first embodiment of the present invention.

Referring to FIG. 1, the organic LED device includes a substrate 100;

a first anode 201 comprising a transparent electrode of ITO (indium tin oxide); a hole-transporting layer 202 comprising an aromatic diamine (of formula (1) above); an electron-transporting layer/luminescence layer 203 comprising tris(8-quinolinolato)aluminum complex (of formula (2) above); a first cathode 204 comprising a material having a low work function, such as Al or Mg—Ag alloy and provided with apertures 205 formed therein;

a transparent insulating layer 300 comprising, e.g., SiN or SiO$_2$;

a second anode 401 comprising a transparent electrode of ITO; a hole-transporting layer 402 comprising an aromatic diamine (of formula (1)); an electron-transporting layer/luminescence layer 403 comprising tris(8-quinolinolato) aluminum complex (of formula (2)) and a fluorescent substance (of formula (3) above); and a second cathode 404 comprising a material having a low work function such as Al or Mg—Ag alloy and provided with apertures 405.

Figure 2:
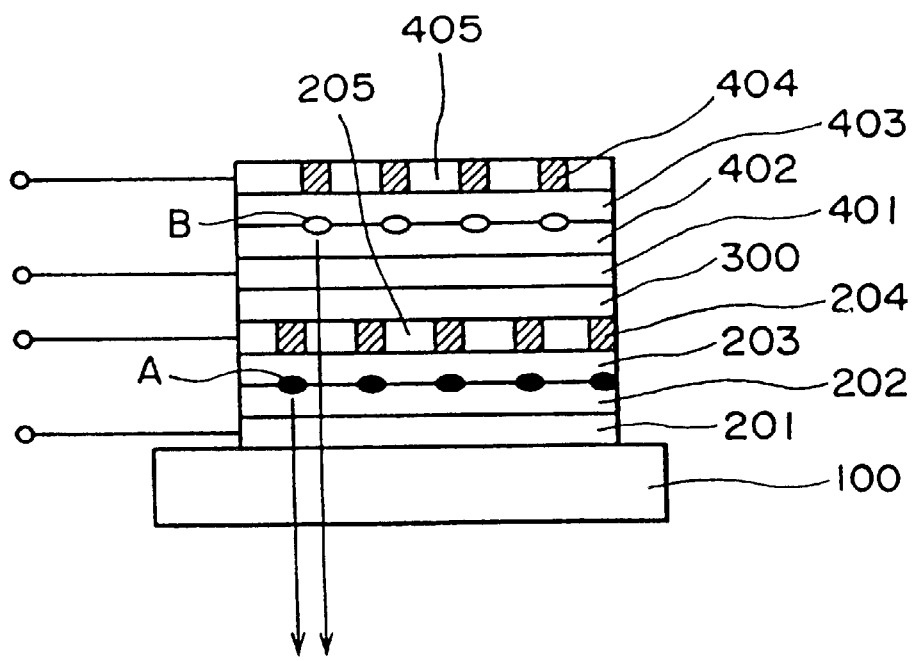
FIGS. 2, 4 and 6 are schematic sectional views illustrating luminescence states in the organic LED devices of FIGS. 1, 3 and 5, respectively.

FIG. 2 schematically illustrates a state of luminescence occurring in the organic LED device of FIG. 1.

Referring to FIG. 2, each portion A represents luminescence caused by recombination of holes injected to the hole-transporting layer 202 from the first anode 201 and electrons injected to the electron-transporting layer 203 from the first anode 204. In this instance, green luminescence inherent to tris(8-quinolinolato)aluminum complex of formula (2) constituting the electron-transporting layer/luminescence layer 203 is emitted. The first cathode 204 is provided with the apertures 205 so that the luminescence is not caused at parts corresponding to the apertures 205.

Referring further to FIG. 2, each portion B represents luminescence caused by recombination of holes injected to the hole-transporting layer 402 from the second anode 401 and electrons injected to the electron-transporting layer 403 from the second anode 404. In this instance, rather than green luminescence inherent to tris(8-quinolinolato) aluminum complex constituting the electron-transporting layer/luminescence layer 403, red luminescence attributable to the fluorescent substance (of formula (3)) added thereto as a dopant is predominant. The second cathode 404 is provided with the apertures 405 so that the luminescence is not caused at parts corresponding to the apertures 405.

The red luminescence flux occurring at the portion B is transmitted through the apertures 205 formed in the first cathode 204 and emitted together with the green luminescence flux occurring at the portions A through the substrate 100.

Accordingly, in this embodiment, pixels of different luminescence colors need not be formed at (horizontally) different positions, but different luminescence colors can be emitted from a horizontally single pixel. As a result, by sufficiently reducing the sizes of the apertures 205 and 405, it is possible to provide an organic LED device from which different luminescence colors can be emitted from luminescence positions which are substantially free from local deviation (with a minimized positional deviation) relative to a pixel size.

Regarding the respective luminescence colors, the green luminescence is caused by a voltage applied between the first anode 201 and the first cathode 204, and the red luminescence is caused by a voltage applied between the second anode 401 and the second cathode 404, so that the respective luminescence colors can be independently emitted, thus allowing at least three color luminescences of green, red and orange (as mixture of green and red) to be issued from a substantially single pixel.

While the perspective layers and pixels may be designed in various manners, a specific example of the device of the above embodiment may be organized in the following dimensions:

(Respective Layer Thickness)

Anode (201, 401): 1200 Å

Hole-transporting layer (202, 402): 500 Å

Electron-transporting layer (203, 403): 500 Å

Cathode (204, 404): 2000 Å

Transparent insulating layer (300): 2000 Å

(Planar Sizes)

Pixel: 300 μm×300 μm

Aperture (205, 405): 50 μm×300 μm (Operation Voltage)

10 volts between each pair of an anode and a cathode.

Figure 3:
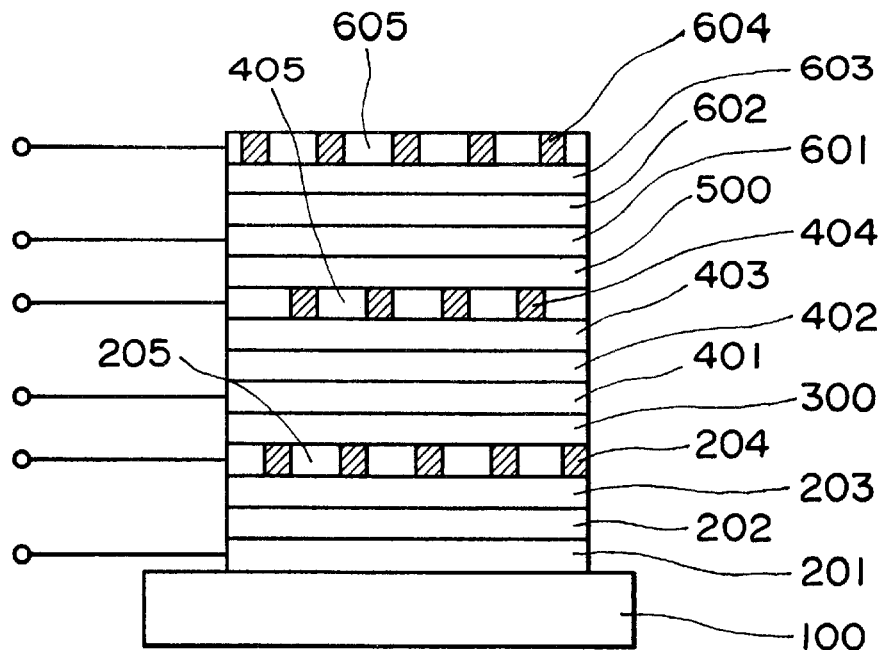

FIG. 3 illustrated a laminar organization of an organic LED device according to a second embodiment of the present invention.

Referring to FIG. 3, the organic LED device includes a substrate 100;

a first anode 201 comprising a transparent electrode of ITO (indium tin oxide); a hole-transporting layer 202 comprising an aromatic diamine (of formula (1) above); an electron-transporting layer/luminescence layer 203 comprising tris(8-quinolinolato)aluminum complex (of formula (2) above); a first cathode 204 comprising a material having a low work function, such as Al or Mg—Ag alloy and provided with apertures 205 formed therein;

a transparent insulating layer 300 comprising, e.g., SiN or SiO$_2$;

a second anode 401 comprising a transparent electrode of ITO; a hole-transporting layer 402 comprising an aromatic diamine (of formula (1)); an electron-transporting layer/luminescence layer 403 comprising tris(8-quinolinolato) aluminum complex (of formula (2)) and a fluorescent substance (of formula (3) above); and a second cathode 404 comprising a material having a low work function such as Al or Mg—Ag alloy and provided with apertures 405;

a transparent insulating layer 500 comprising, e.g., SiN or SiO$_2$;

a third anode 601 comprising a transparent electrode of ITO; a hole-transporting layer 602 comprising an aromatic diamine (of formula (1)); an electron-transporting layer/luminescence layer 603 comprising tris(8-quinolinolato) aluminum complex (of formula (2)) and a distyryl derivative (of formula (4) below); and a third cathode 604 comprising a material having a low work function such as Al or Mg—Ag alloy and provided with apertures 605.

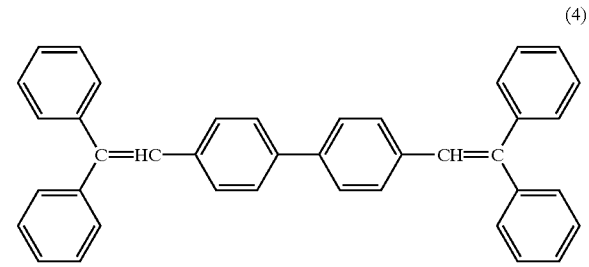

(4)

Figure 4:
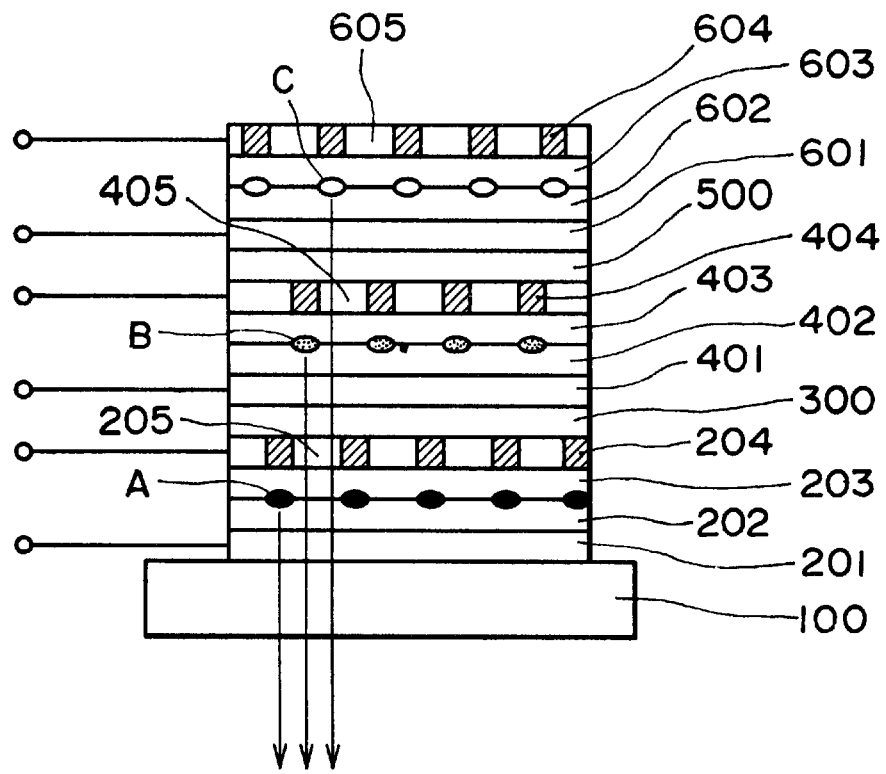

FIG. 4 schematically illustrates a state of luminescence occurring in the organic LED device of FIG. 3.

Referring to FIG. 4, each portion A represents luminescence caused by recombination of holes injected to the hole-transporting layer 202 from the first anode 201 and electrons injected to the electron-transporting layer 203 from the first anode 204. In this instance, green luminescence inherent to tris(8-quinolinolato)aluminum complex of formula (2)) constituting the electron-transporting layer/ luminescence layer 203 is emitted. The first cathode 204 is provided with the apertures 205 so that the luminescence is not caused at parts corresponding to the apertures 205.

Referring further to FIG. 4, each portion B represents luminescence caused by recombination of holes injected to the hole-transporting layer 402 from the second anode 401 and electrons injected to the electron-transporting layer 403 from the second anode 404. In this instance, rather than green luminescence inherent to tris(8-quinolinolato) aluminum complex constituting the electron-transporting layer/luminescence layer 403, red luminescence attributable to the fluorescent substance (of formula (3)) added thereto as a dopant is predominant. The second cathode 404 is provided with the apertures 405 so that the luminescence is not caused at parts corresponding to the apertures 405.

Further referring to FIG. 4, each portion C represents luminescence caused by recombination of holes injected to the hole-transporting layer 602 from the third anode 601 and electrons injected to the electron-transporting layer 603 from the third anode 604. In this instance, blue luminescence attributable to the distyryl derivative (of formula (4)) added to tris(8-quinolinolato)aluminum complex as a dopant is predominant. The third cathode 604 is provided with the apertures 605 so that the luminescence is not caused at parts corresponding to the apertures 605.

The red and blue luminescence fluxes occurring at the portion B and C are transmitted through the apertures 205 formed in the first cathode 204 and emitted together with the green luminescence flux occurring at the portions A through the substrate 100.

Accordingly, in this embodiment, the different luminescence colors of R, G and B can be emitted from a horizontally single pixel. As a result, by sufficiently reducing the sizes of the apertures 205, 405 and 605, it is possible to provide an organic LED device from which different luminescence colors can be emitted with substantially no local deviation relative to a pixel size.

Regarding the respective luminescence colors, the green luminescence is caused by a voltage applied between the first anode 201 and the first cathode 204, the red luminescence is caused by a voltage applied between the second anode 401 and the second cathode 404, and the blue color is caused by a voltage applied between the third mode 601 and the third cathode 604, so that the respective luminescence colors can be independently emitted.

Figure 5:
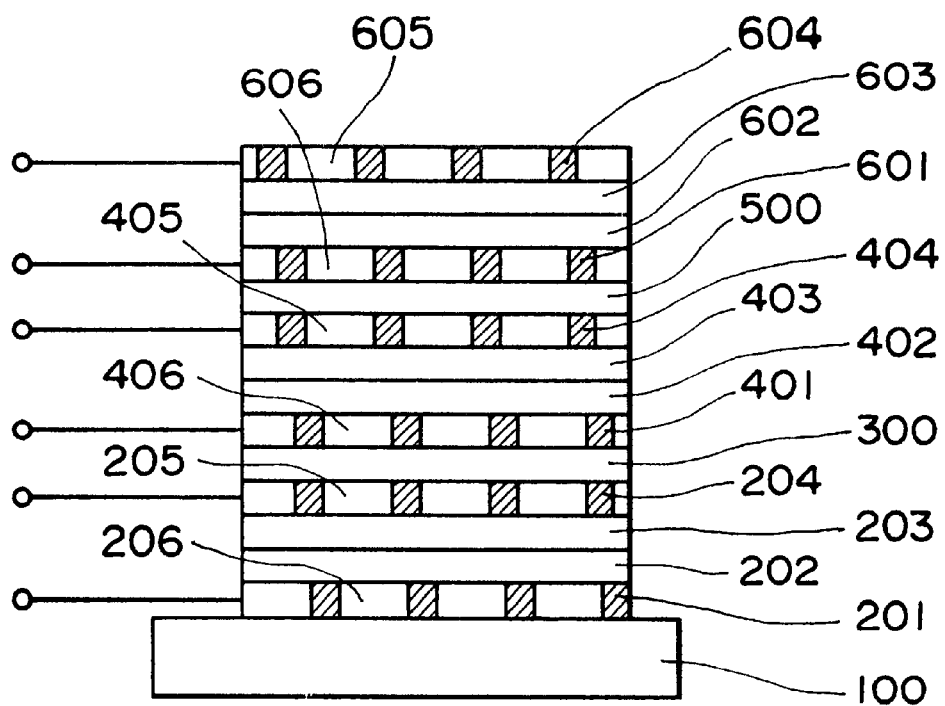

FIG. 5 illustrates a laminar organization of an organic LED device according to a third embodiment of the present invention.

Referring to FIG. 5, the organic LED device includes a substrate 100;

a first anode 201 comprising a transparent electrode of ITO (indium tin oxide) provided with apertures 206; a hole-transporting layer 202 comprising an aromatic diamine (of formula (1) above); an electron-transporting layer/luminescence layer 203 comprising tris(8-quinolinolato) aluminum complex (of formula (2) above); a first cathode 204 comprising a material having a low work function, such as Al or Mg—Ag alloy and provided with apertures 205 formed therein;

a transparent insulating layer 300 comprising, e.g., SiN or SiO$_2$;

a second anode 401 comprising a transparent electrode of ITO; a hole-transporting layer 402 comprising an aromatic diamine (of formula (1)); an electron-transporting layer/luminescence layer 403 comprising tris(8-quinolinolato) aluminum complex (of formula (2)) and a fluorescent substance (of formula (3) above); and a second cathode 404 comprising a material having a low work function such as Al or Mg—Ag alloy and provided with apertures 405;

a transparent insulating layer 500 comprising, e.g., SiN or SiO$_2$;

a third anode 601 comprising a transparent electrode of ITO; a hole-transporting layer 602 comprising an aromatic diamine (of formula (1)); an electron-transporting layer/luminescence layer 603 comprising tris(8-quinolinolato) aluminum complex (of formula (2)) and a distyryl derivative (of formula (4) above); and a third cathode 604 comprising a material having a low work function such as Al or Mg—Ag alloy and provided with apertures 605.

Figure 6:
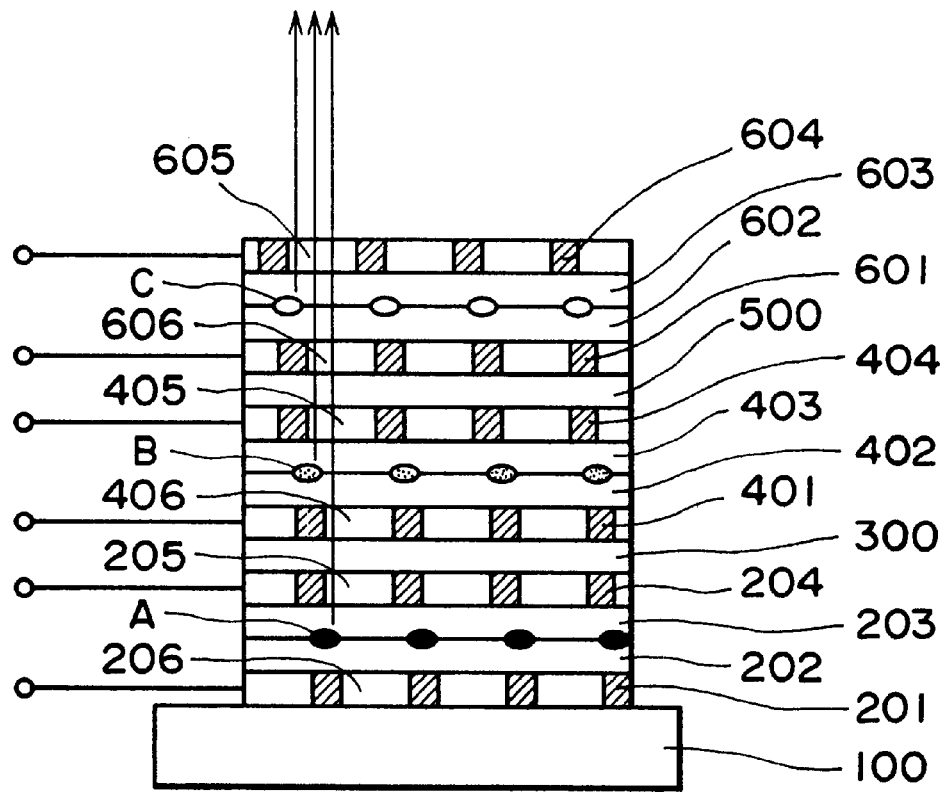

FIG. 6 schematically illustrates a state of luminescence occurring in the organic LED device of FIG. 5.

Referring to FIG. 6, each portion A represents luminescence caused by recombination of holes injected to the hole-transporting layer 202 from the first anode 201 and electrons injected to the electron-transporting layer 203 from the first anode 204. In this instance, green luminescence inherent to tris(8-quinolinolato)aluminum complex of formula (2) constituting the electron-transporting layer/luminescence layer 203 is emitted. The first anode 201 is provided with apertures 206, the first cathode 204 is provided with apertures 205, and the apertures 206 and 205 are formed at mutually slightly deviated positions, so that the luminescence occurs at positions corresponding to edges of the apertures 205 and 206.

Referring further to FIG. 6, each portion B represents luminescence caused by recombination of holes injected to the hole-transporting layer 402 from the second anode 401 and electrons injected to the electron-transporting layer 403 from the second anode 404. In this instance, rather than green luminescence inherent to tris(8-quinolinolato) aluminum complex constituting the electron-transporting layer/luminescence layer 403, red luminescence attributable to the fluorescent substance (of formula (3)) added thereto as a dopant is predominant. The second anode 401 is provided with apertures 406, the second cathode 404 is provided with apertures 405, and the apertures 406 and 405 are formed at mutually slightly deviated positions, so that the luminescence occurs at positions corresponding to edges of the apertures 405 and 406.

Further referring to FIG. 6, each portion C represents luminescence caused by recombination of holes injected to the hole-transporting layer 602 from the third anode 601 and electrons injected to the electron-transporting layer 603 from the third anode 604. In this instance, blue luminescence attributable to the distyryl derivative (of formula (4)) added to tris(8-quinolinolato)aluminum complex as a dopant is predominant. The third anode 601 is provided with apertures 606, the third cathode 604 is provided with apertures 605, and the apertures 606 and 605 are formed at mutually slightly deviated positions, so that the luminescence occurs at positions corresponding to edges of the apertures 605 and 606.

The portions A, B and C causing luminescence are disposed at edges of the apertures, so that the respectively generated luminescence fluxes at A, B and C are emitted through the apertures 205 of the first cathode 204, the apertures 405 of the second 404 and the apertures 605 of the third cathode 604 to be emitted to a side opposite to the substrate 100.

Accordingly, in this embodiment, the different luminescence colors of R, G and B can be emitted from a horizontally single pixel. As a result, by sufficiently reducing the sizes of the apertures 205, 405 and 605, it is possible to provide an organic LED device from which different luminescence colors can be emitted with substantially no local deviation relative to a pixel size.

Regarding the respective luminescence colors, the green luminescence is caused by a voltage applied between the first anode 201 and the first cathode 204, the red luminescence is caused by a voltage applied between the second anode 401 and the second cathode 404, and the blue color is caused by a voltage applied between the third mode 601 and the third cathode 604, so that the respective luminescence colors can be independently emitted.

Figure 7:
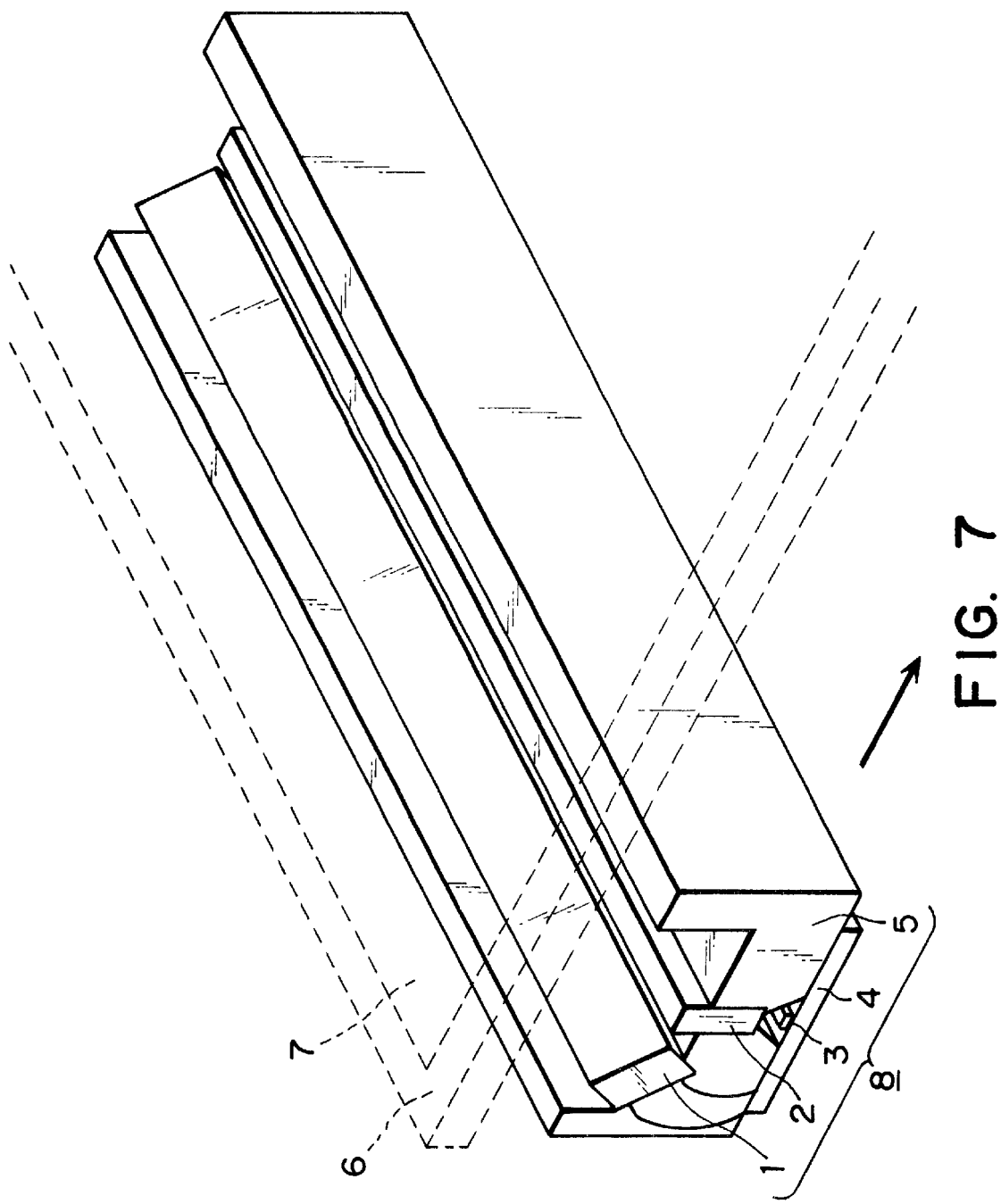
FIG. 7 is a partial perspective of an image-reading apparatus including an organic LED device of the second embodiment (FIG. 3) as a light source for illuminating an original.

FIG. 7 illustrates a part of an image-reading apparatus 8 adopting the organic LED device shown in FIG. 3 according to the second embodiment of the present invention as a light source for illuminating an original.

Referring to FIG. 7, the image-reading apparatus 8 includes an organic LED device 1 as described above, a rod lens array 2, a photoconverter element array 3, a circuit substrate 4, a housing 5 and a glass sheet 6 supporting an original 7.

Light flux emitted from the organic LED device 1 supported in the housing 5 is transmitted through the glass sheet 6 to illuminate a surface of the original 7 supported thereon. Light flux reflected at the original 7 is passed through the rod lens array 2 to be focused at the photoconverter element array 3 mounted on the circuit substrate 4. As a result, image data on the original 7 surface is read out by conversion into electric signals.

The image reading apparatus 8 thus comprising the organic LED device 1, the rod lens array 2, the photoelectric converter element array 3, the circuit substrate 4 and the housing 5 is disposed to extend in a direction parallel to a side of the original supporting glass sheet 6 and is moved in an indicated arrow direction perpendicular to the extension direction thereof, so that images are read in a rectangular region determined by the length and the movement distance of the image reader 8.

Figure 8:
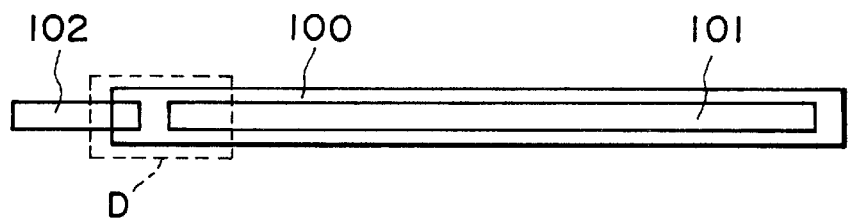
FIG. 8 is a plan view of the organic LED device of FIG. 7 as viewed from the glass substrate side thereof.

FIG. 8 shows a plan view of the organic LED device 1 in FIG. 7 as viewed from the side of the glass sheet 6 in FIG. 7.

Referring to FIG. 8, the organic LED device (1) includes a transparent substrate 100 of, e.g., glass or plastic sheet, a light-emitting unit 101 as observed through the transparent substrate 100 and a flexible circuit sheet 102. The anode, the cathode and the organic layer constituting the light-emitting unit 101 are disposed on a back of the substrate 100.

Figure 9:
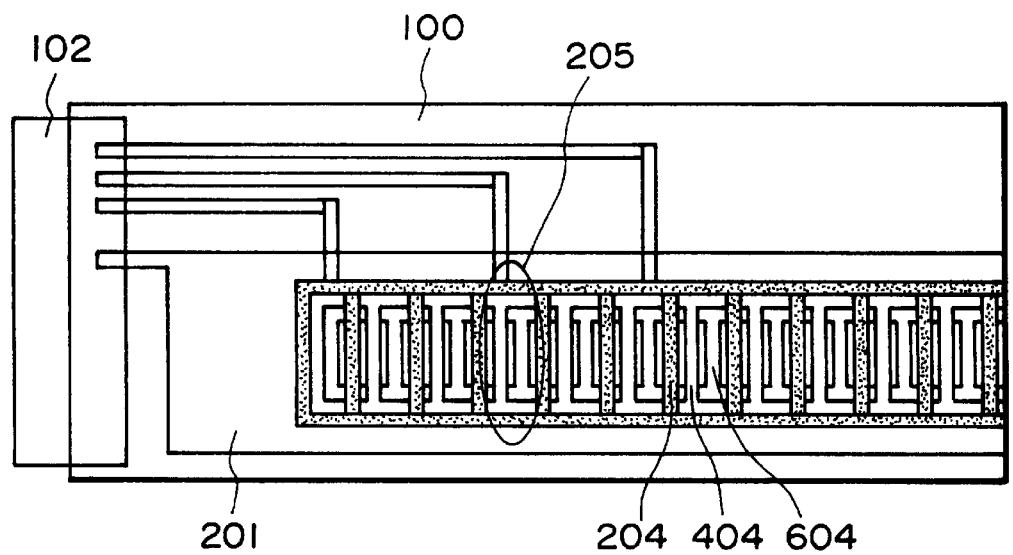
FIG. 9 is an enlarged view of a part D shown in FIG. 8.

FIG. 9 is an enlarged view of a section D shown in FIG. 8 showing the organization of the light-emitting unit 101 as observed through the transparent substrate 100. More specifically, regarding the organization of the light-emitting unit (101 in FIG. 8) formed on the transparent substrate 100, FIG. 9 shows a first anode 201 (of the organic LED device shown in FIG. 3) comprising a transparent electrode of ITO, a first cathode 204 comprising a conductor having a low work function such as Al or Mg—Ag alloy provided with apertures 205, a second cathode 404, and a third cathode 604. The respective electrodes are connected to the flexible circuit sheet 102.

Luminescence emitted from the third and second luminescence layers (603 and 403 in FIG. 3) are transmitted through the apertures 205 and emitted for illuminating the original surface together with the luminescence emitted from the first luminescence layer (203 in FIG. 3).

According to the above-mentioned image-reading apparatus, the positions of luminescence of different colors are substantially free from positional deviation, so that the directionality of illumination light reaching a certain point on the original is not different depending on different luminescence colors, so that the liability of color irregularity due to surface gloss of the original is deviated, thus allowing high-quality reading.

Figure 10:
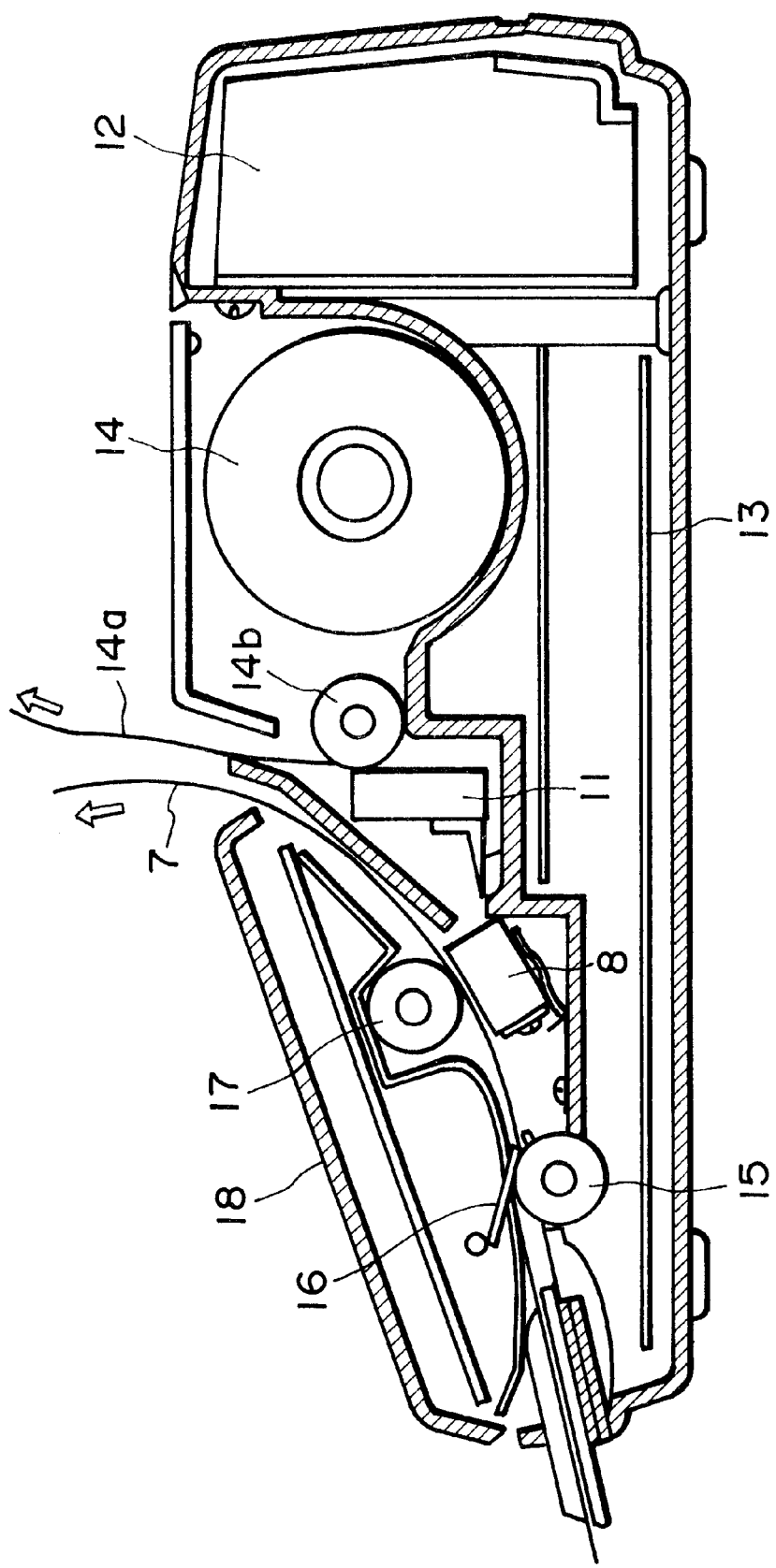
FIG. 10 is an illustration of a facsimile apparatus including the image-reading apparatus of FIG. 7.
Figure 11:
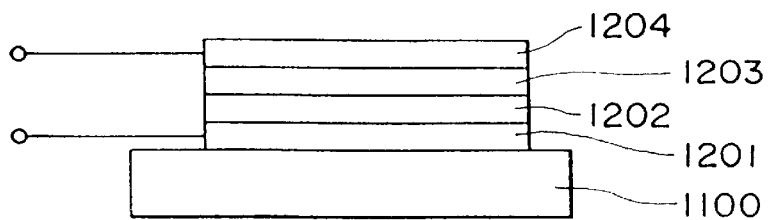
FIG. 11 is a schematic sectional view showing a typical organization of a conventional organic LED device.
Figure 12:
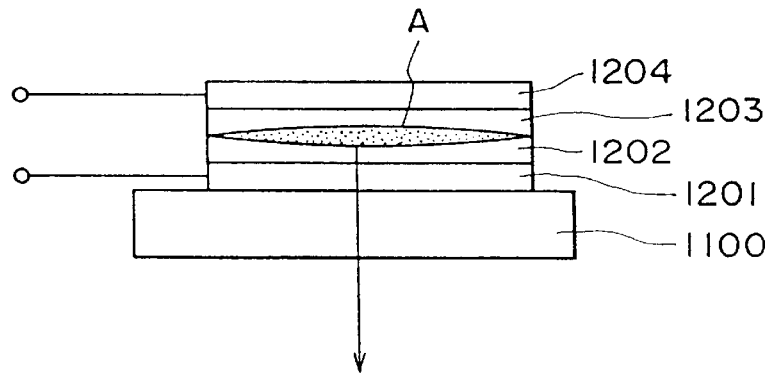
FIG. 12 is a schematic sectional view illustrating a luminescence state in the organic LED device of FIG. 11.
Figure 13:
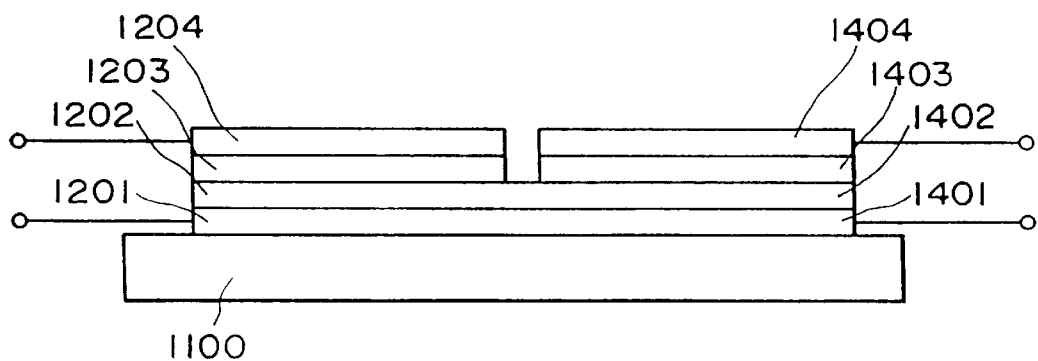
FIG. 13 is a schematic sectional view showing a typical organization of a conventional organic LED including separate pixels of mutually different luminescence colors.

FIG. 10 is a side sectional view of a facsimile apparatus as a data processing apparatus including the image-reading apparatus of FIG. 7, which allows high-quality data processing through high-quality image reading owing to the use of an image-reading apparatus according to the present invention. Referring to FIG. 10, the facsimile apparatus incudes an image-reading apparatus 8, a recording head 11, a power supply unit 12, a system control board 13, a recording medium roll 14 from which a recording medium 14a is supplied via a platen roller 14b so as to allow recording by the recording head 11, a feed roller 15 for feeding an original 7 via a separation claw 16 and a platen roller 17, and an operation panel 18.

The image reading apparatus according to the present invention is applicable not only to such a facsimile apparatus but also to various data processing apparatus, such as a scanner apparatus, utilizing a function of converting optical data into electric signals.

The organic LED device according to the present invention can also be used to constitute a (color) display apparatus allowing a high-quality display free from recognition of color points.

What is claimed is:

1. A luminescence device, comprising:

a substrate; and a laminated layer structure formed on said substrate, said layer structure including a plurality of luminescence layers emitting different luminescence colors and a plurality of electrodes forming plural pairs of electrodes each sandwiching an associated luminescence layer so as to form a luminescence unit emitting a color of luminescence flux, wherein at least one of said plurality of electrodes is provided with apertures, through which a luminescence flux emitted from at least one of said luminescence layers is transmitted, and a plurality of said luminescence units are stacked in a direction perpendicular to a surface of said substrate so as to emit the plurality of different colors of the luminescence flux in the direction perpendicular to said substrate.

2. A luminescence device according to claim 1, wherein each luminescence layer comprises at least one organic compound layer.

3. A luminescence device according to claim 1, wherein plural layers of electrodes each belonging to different pairs of electrodes sandwiching associated luminescence layers of different luminescence colors are respectively provided with apertures of which positions or sizes are different from each other.

4. A luminescence device according to claim 3, wherein each pair of electrodes sandwiching an associated luminescence layer comprises one transparent electrode on a side closer to said substrate and another electrode which is opaque and provided with apertures on a side more remote from said substrate, and the luminescence flux is emitted through said substrate.

5. A luminescence device according to claim 1, wherein at least one luminescence layer is sandwiched by a pair of electrodes which are both provided with apertures of which positions or sizes are different from each other.

6. A luminescence device according to claim 5, wherein said pair of electrodes comprises one transparent electrode on a side closer to said substrate and another electrode which is opaque, and luminescence light flux is emitted in a direction away from said substrate.

7. An image-reading apparatus, including a luminescence device according to claim 1 as an illumination light source.

8. A data processing apparatus including an image-reading apparatus according to claim 7 as an image-reading unit.

9. A display apparatus, including a luminescence device according to claim 1 as a display unit.

* * * * *

UNITED STATES PATENT AND TRADEMARK OFFICE
CERTIFICATE OF CORRECTION

PATENT NO. : 6,566,806 B1  Page 1 of 1
DATED : May 20, 2003
INVENTOR(S) : Tatsundo Kawai It is certified that error appears in the above-identified patent and that said Letters Patent is hereby corrected as shown below:

<u>Title page,</u>
Item [56], References Cited, U.S. PATENT DOCUMENTS,
"6,284,393 B1 * 12/2001 Hosokawa et al." should read
-- 6,284,393 B1 * 9/2001 Hosokawa et al. --.

<u>Column 3,</u>
Line 39, "directively" should read -- directivity --.

<u>Column 4,</u>
Line 9, "least:" should read -- least --.

Signed and Sealed this

Twenty-seventh Day of January, 2004

JON W. DUDAS
*Acting Director of the United States Patent and Trademark Office*